(12) United States Patent
Kim et al.

(10) Patent No.: US 10,811,379 B2
(45) Date of Patent: Oct. 20, 2020

(54) SEMICONDUCTOR PACKAGE

(71) Applicant: SAMSUNG ELECTRONICS CO., LTD., Suwon-si (KR)

(72) Inventors: Doo Il Kim, Suwon-si (KR); Yong Ho Baek, Suwon-si (KR); Won Wook So, Suwon-si (KR); Young Sik Hur, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/287,064

(22) Filed: Feb. 27, 2019

(65) Prior Publication Data
US 2020/0013743 A1 Jan. 9, 2020

(30) Foreign Application Priority Data

Jul. 3, 2018 (KR) ........................ 10-2018-0076940

(51) Int. Cl.
*H01L 23/495* (2006.01)
*H01L 23/00* (2006.01)
(Continued)

(52) U.S. Cl.
CPC ............ *H01L 24/16* (2013.01); *H01L 23/041* (2013.01); *H01L 23/3128* (2013.01); *H01L 23/3135* (2013.01); *H01L 23/3171* (2013.01); *H01L 23/49822* (2013.01); *H01L 23/49827* (2013.01); *H01L 23/49866* (2013.01); *H01L 24/04* (2013.01); *H01L 2224/022* (2013.01);
(Continued)

(58) Field of Classification Search
CPC ............... H01L 23/041; H01L 23/3128; H01L 23/49822; H01L 23/49827; H01L 23/49866; H01L 23/3171; H01L 24/04; H01L 24/16

USPC .......................................................... 257/668
See application file for complete search history.

(56) References Cited

U.S. PATENT DOCUMENTS 8,778,738 B1  7/2014  Lin et al.
8,785,299 B2 * 7/2014  Mao .................... H01L 23/48
                                              257/678
(Continued)

FOREIGN PATENT DOCUMENTS

KR  10-2015-0004738 A  1/2015
KR  10-2017-0061370 A  6/2017
KR  10-2018-0035572 A  4/2018

OTHER PUBLICATIONS

Communication dated Sep. 4, 2019, issued by the Korean Patent Office in counterpart Korean Application No. 10-2018-0076940.
(Continued)

Primary Examiner — Luan C Thai
(74) Attorney, Agent, or Firm — Sughrue Mion, PLLC

(57) ABSTRACT

A semiconductor package includes a semiconductor chip including a body, a connection pad, a passivation film, a first connection bump disposed, and a first coating layer; an encapsulant covering at least a portion of the semiconductor chip; and a connection structure including an insulating layer, a redistribution layer, and a connection via. The first connection bump includes a low melting point metal, the redistribution layer and the connection via include a conductive material, and the low melting point metal has a melting point lower than a melting point of the conductive material.

17 Claims, 15 Drawing Sheets

(51) Int. Cl.
H01L 23/31 (2006.01)
H01L 23/498 (2006.01)
H01L 23/04 (2006.01)

(52) U.S. Cl.
CPC ............... *H01L 2224/0401* (2013.01); *H01L 2224/16059* (2013.01); *H01L 2224/16235* (2013.01); *H01L 2224/16501* (2013.01); *H01L 2224/16506* (2013.01)

(56) References Cited

U.S. PATENT DOCUMENTS

| | | | |
|---|---|---|---|
| 9,000,584 B2* | 4/2015 | Lin | H01L 24/19 257/737 |
| 9,520,372 B1 | 12/2016 | Jeng et al. | |
| 9,595,482 B2* | 3/2017 | Chen | H01L 23/481 |
| 9,728,498 B2* | 8/2017 | Su | H01L 24/20 |
| 2015/0008587 A1 | 1/2015 | Lin et al. | |
| 2017/0154838 A1* | 6/2017 | Kim | H01L 21/486 |
| 2017/0186655 A1 | 6/2017 | Chen | |
| 2018/0090402 A1* | 3/2018 | Kim | H01L 24/16 |

OTHER PUBLICATIONS

Communication dated Dec. 10, 2019, issued by the Taiwan Patent Office in counterpart Taiwan Application No. 108106184.

\* cited by examiner

II-II'

SEMICONDUCTOR PACKAGE

CROSS-REFERENCE TO RELATED APPLICATION

This application claims the benefit of priority to Korean Patent Application No. 10-2018-0076940, filed on Jul. 3, 2018 with the Korean Intellectual Property Office, the entirety of which is incorporated herein by reference.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

The semiconductor package is manufactured by redistributing an integrated circuit (IC) in a state of a bare die through a redistribution layer (RDL), and encapsulating it using an encapsulant. Meanwhile, as the types of chips to be applied vary, such as power management ICs (PMICs), there are cases in which chips are embedded in a semiconductor package in the form of a packaged integrated circuit (Packaged IC) as well as a bare die.

SUMMARY

An aspect of the present disclosure provides a semiconductor package, capable of preventing damage to a connection pad in a process of a probe test when a semiconductor chip is packaged in the form of a packaged integrated circuit, preventing contamination of a connection pad, caused by bleeding of an encapsulant, reducing thickness, despite of a form of the packaged integrated circuit, and easily forming a redistribution layer (RDL) on an active surface of a semiconductor chip.

According to an aspect of the present disclosure, a semiconductor chip in the form of a packaged integrated circuit is implemented using a method for forming a connection bump and a coating layer, on which a grinding treatment is performed, on a connection pad of a bare die, and it is packaged to manufacture a semiconductor package.

According to an aspect of the present disclosure, a semiconductor package includes: a semiconductor chip including a body having an active surface on which a connection pad is disposed and an inactive surface opposing the active surface, a passivation film disposed on the active surface of the body and covering at least a portion of the connection pad, a first connection bump disposed on the passivation film and electrically connected to the connection pad, and a first coating layer disposed on the passivation film and covering at least a portion of a side surface of the first connection bump; an encapsulant covering at least a portion of the semiconductor chip; and a connection structure including an insulating layer disposed on the first coating layer of the semiconductor chip, a redistribution layer disposed on the insulating layer, and a connection via passing through the insulating layer and electrically connecting the first connection bump to the redistribution layer. The first connection bump includes a low melting point metal, the redistribution layer and the connection via include a conductive material, and the low melting point metal has a melting point lower than a melting point of the conductive material.

According to an aspect of the present disclosure, a semiconductor package includes: a semiconductor chip including a body having an active surface on which a connection pad is disposed and an inactive surface opposing the active surface, a passivation film disposed on the active surface of the body and covering at least a portion of the connection pad, a first connection bump disposed on the passivation film and electrically connected to the connection pad, a first coating layer disposed on the passivation film and covering at least a portion of a side surface of the first connection bump, a second connection bump disposed between the connection pad and the first connection bump and electrically connecting the connection pad to the first connection bump, a second coating layer disposed on the passivation film and covering at least a portion of a side surface of the second connection bump, and an intermediate layer disposed between the second coating layer and the first coating layer and covering at least a portion of the first connection bump; an encapsulant covering at least a portion of the semiconductor chip; and a connection structure including an insulating layer disposed on the first coating layer of the semiconductor chip, a redistribution layer disposed on the insulating layer, and a connection via passing through the insulating layer and electrically connecting the first connection bump to the redistribution layer. The first connection bump and the second connection bump include different materials.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
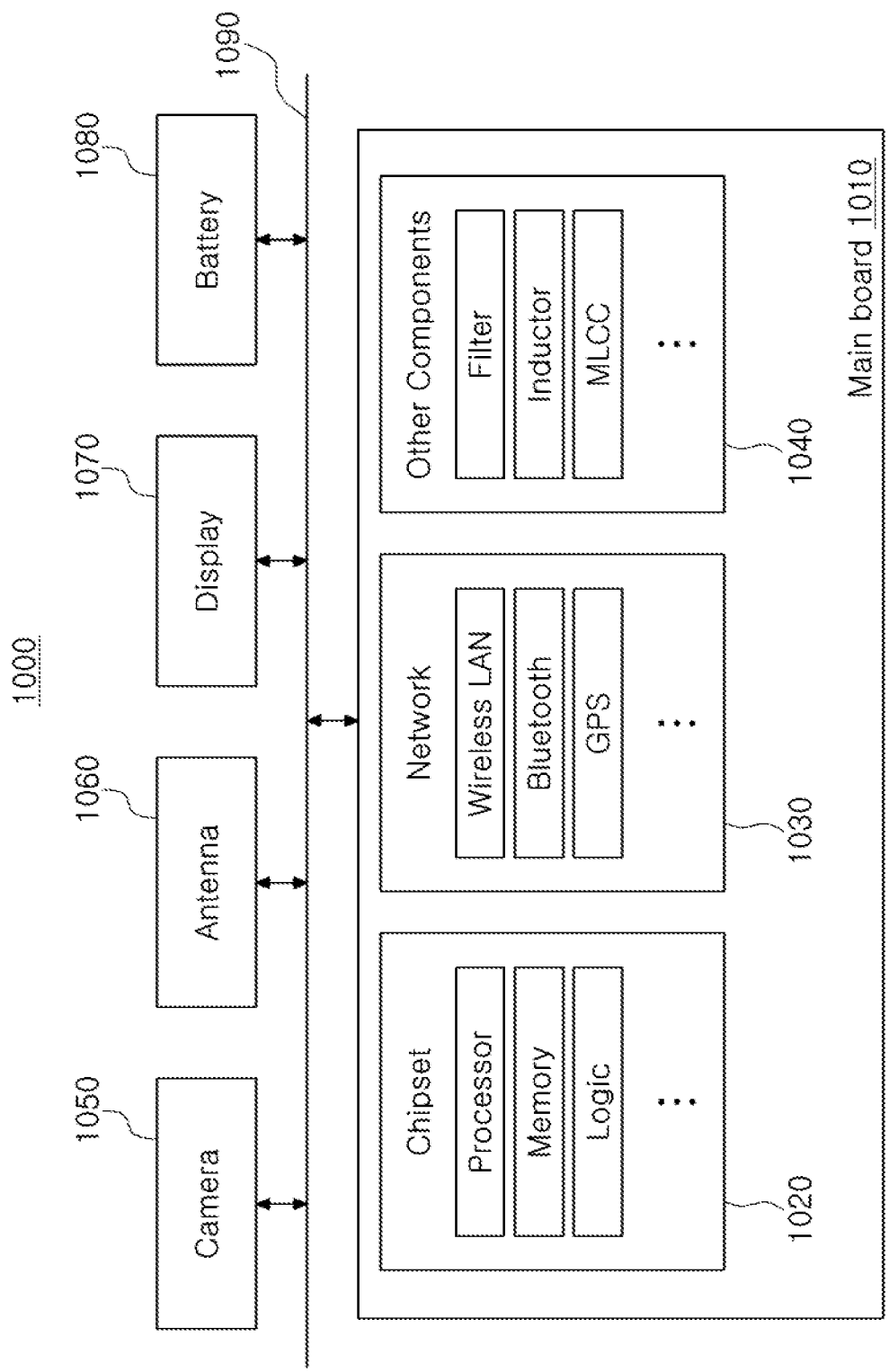
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may receive a motherboard 1010. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
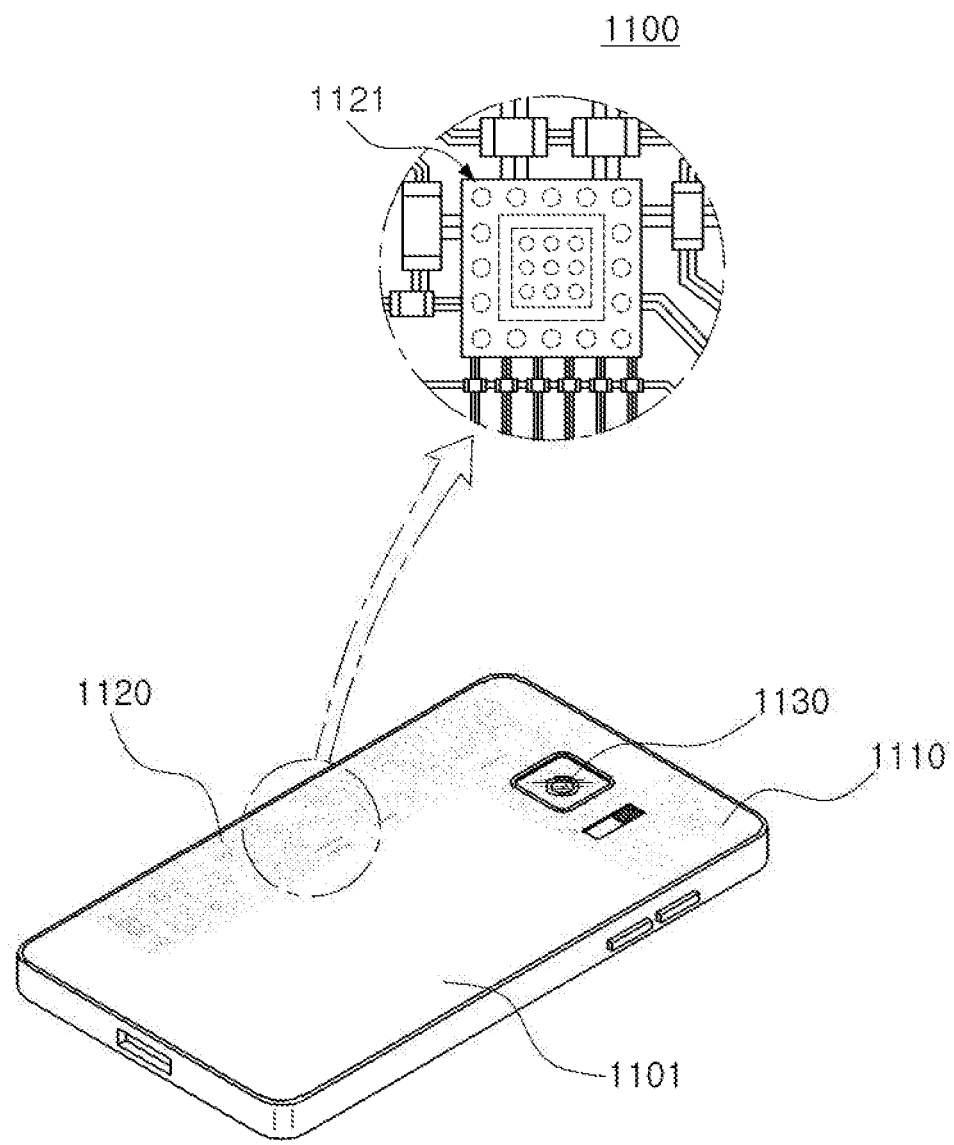
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a main board may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
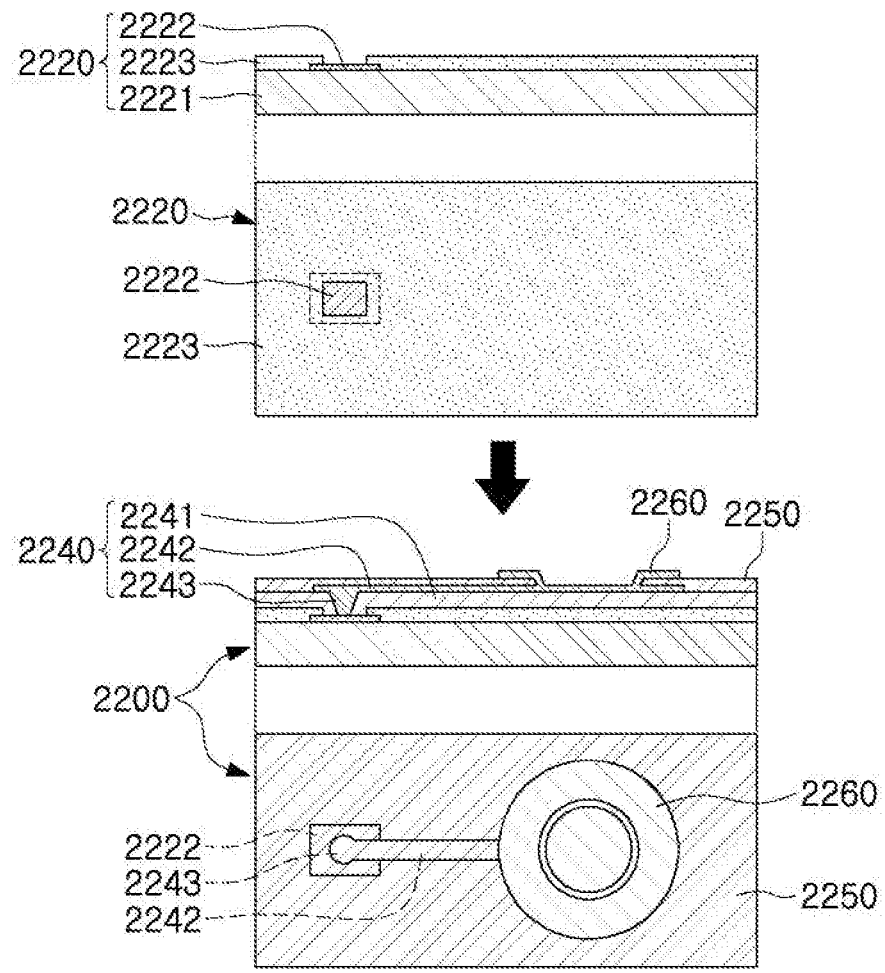
FIGS. 3A and 3B are schematic cross-sectional views illustrating states of a fan-in semiconductor package before and after being packaged.
Figure 3B:
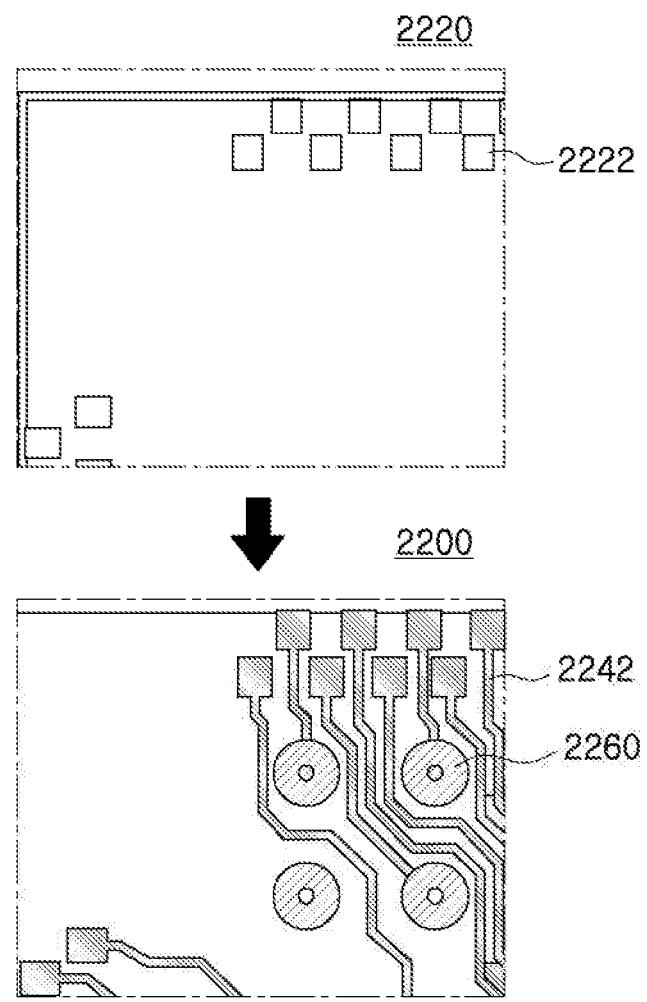

FIGS. 3A and 3B are schematic cross-sectional views illustrating states of a fan-in semiconductor package before and after being packaged.

Figure 4:
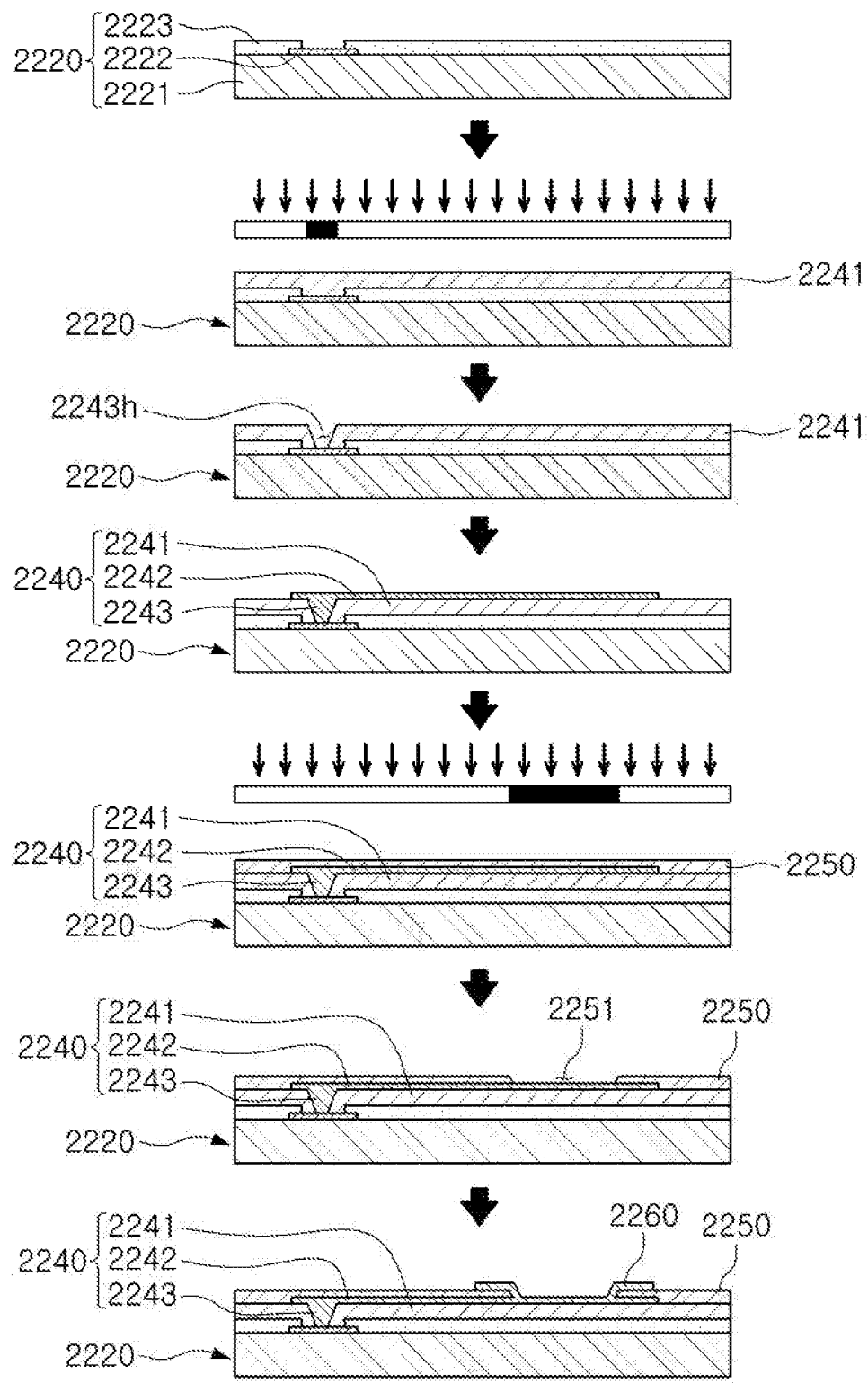
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a metallic material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
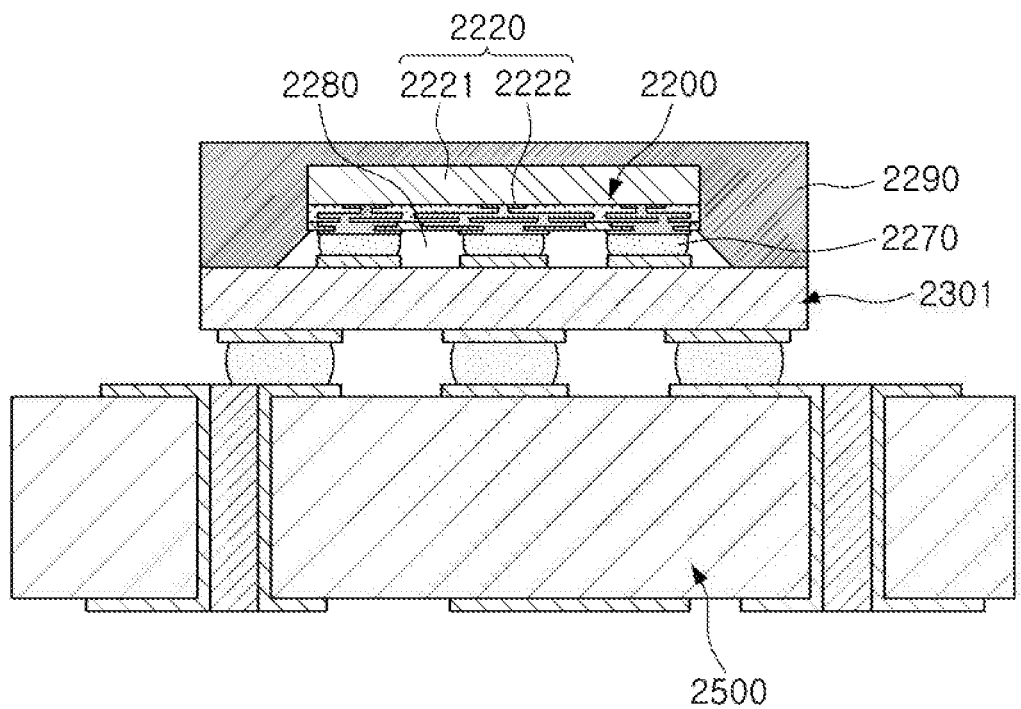
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board and is ultimately mounted on a mainboard of an electronic device.

Figure 6:
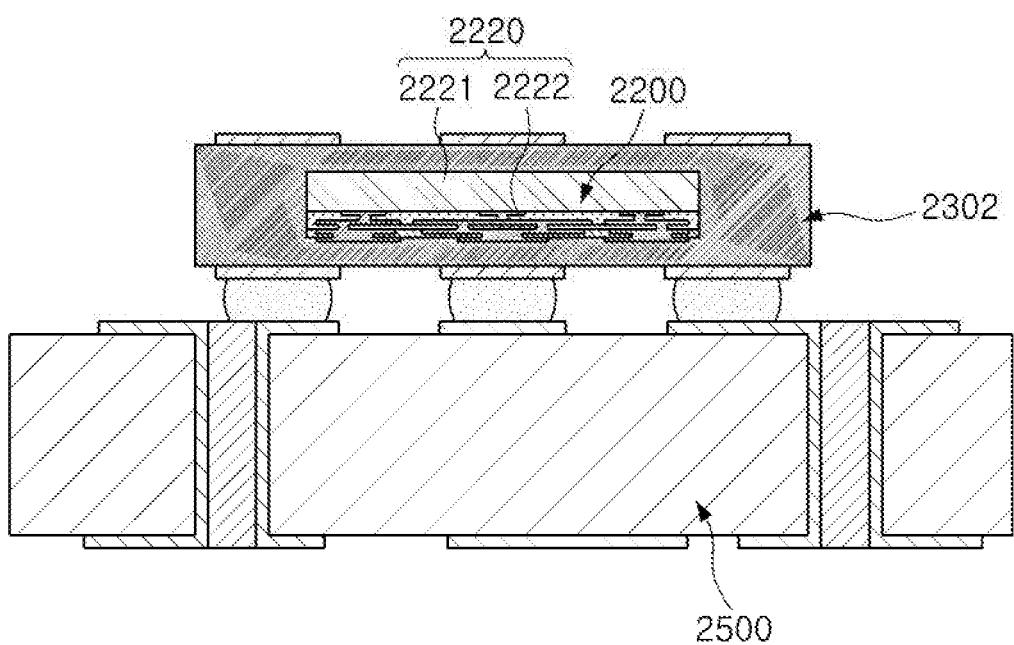
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may ultimately be mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
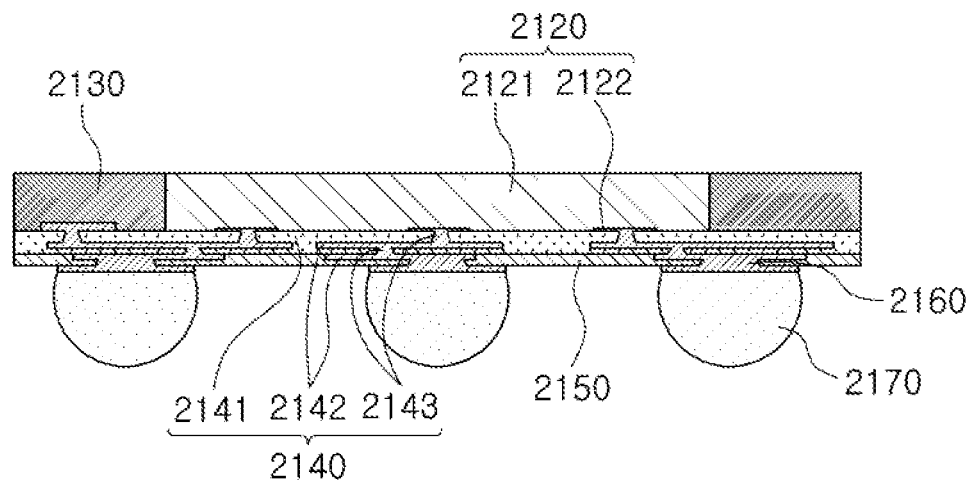
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2141, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
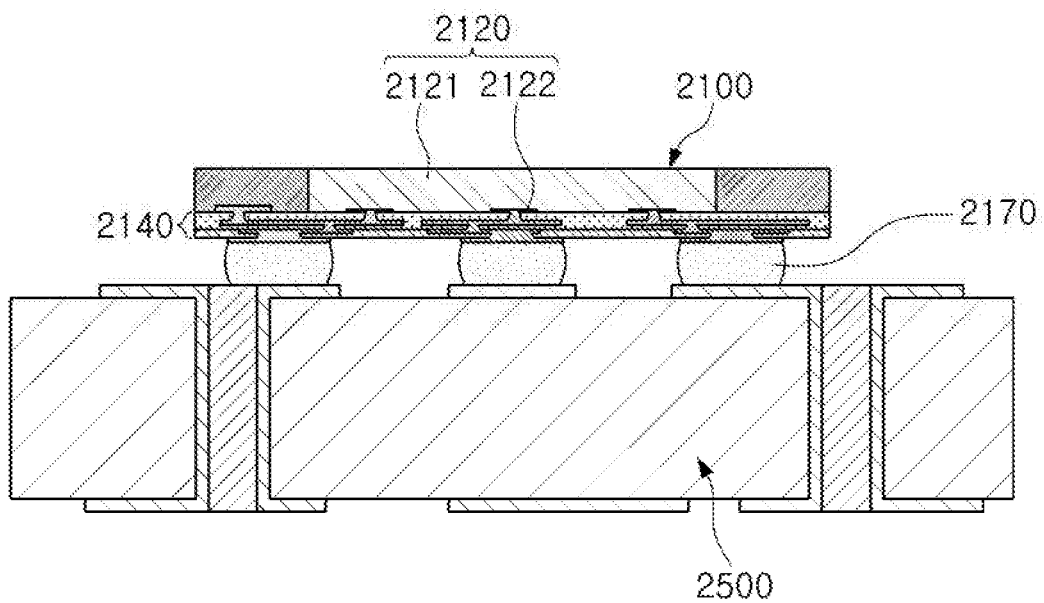
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Hereinafter, a semiconductor package, capable of preventing damage to a connection pad in a process of a probe test when a semiconductor chip is packaged in the form of a packaged integrated circuit, preventing contamination of a connection pad, caused by bleeding of an encapsulant, reducing thickness, despite of a form of the packaged integrated circuit, and easily forming a redistribution layer (RDL) on an active surface of a semiconductor chip, will be described with reference to the drawings.

Figure 9:
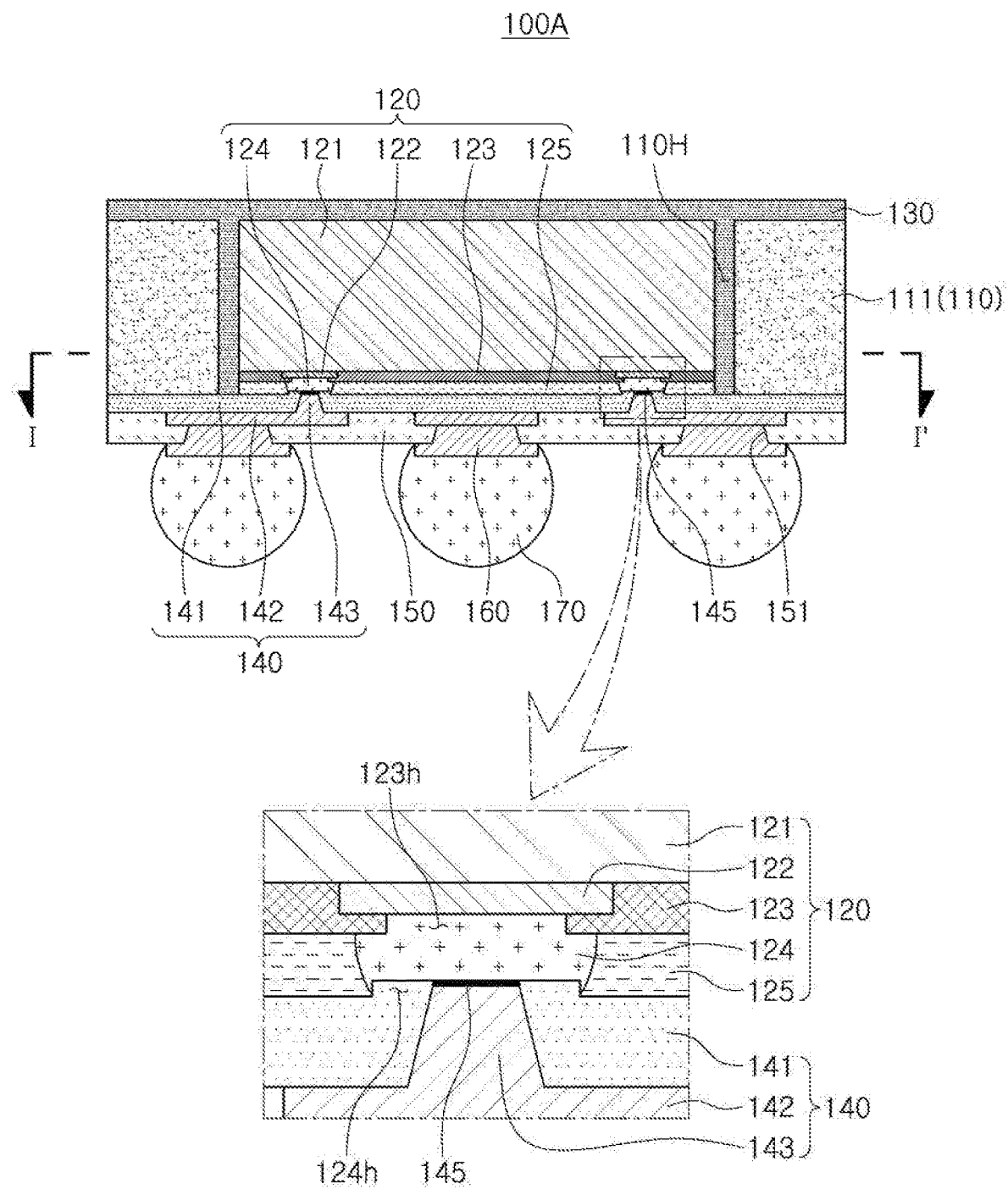
FIG. 9 is a schematic cross-sectional view illustrating an example of a semiconductor package.

FIG. 9 is a schematic cross-sectional view illustrating an example of a semiconductor package.

Figure 10:
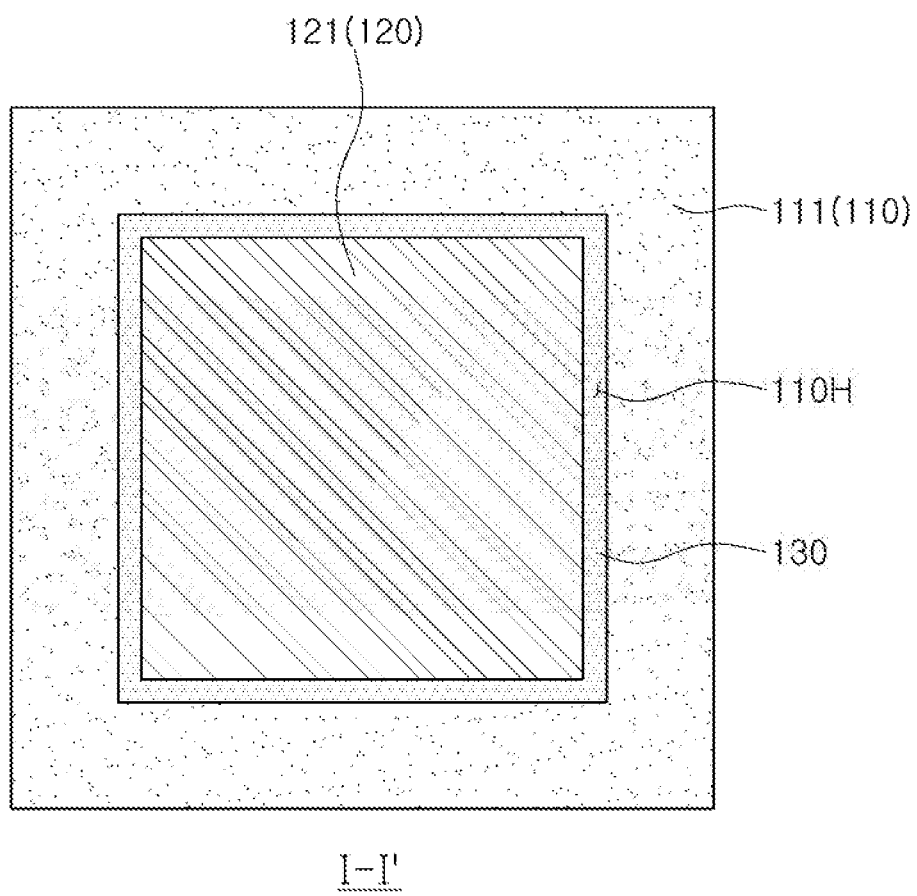
FIG. 10 is a schematic plan view taken along line I-I' of the semiconductor package of FIG. 9.

FIG. 10 is a schematic plan view taken along line I-I' of the semiconductor package of FIG. 9.

Referring to FIG. 9, a fan-out semiconductor package 100A according to an exemplary embodiment may include a frame 110 having a through-hole 110H, a semiconductor chip 120 disposed in the through-hole 110H of the frame 110 and having an active surface on which a connection pad 122 is disposed and an inactive surface disposed opposing the active surface, an encapsulant 130 covering at least a portion of the frame 110 and the semiconductor chip 120 and filling at least a portion of the through-hole 110H, a connection structure 140 disposed on the frame 110 and the active surface of the semiconductor chip 120, a passivation layer 150 disposed on the connection structure 140, a underbump metal layer 160 disposed in the opening 151 of the passivation layer 150, and an electrical connection structure 170 disposed on the passivation layer 150 and connected to the underbump metal layer 160. In detail, the semiconductor chip 120 may include a body 121 having an active surface on which the connection pad 122 is disposed and an inactive surface opposing the active surface, a passivation film 123 disposed on the active surface of the body 121 and covering at least a portion of the connection pad 122, a first connection bump 124 disposed on the passivation film 123 and electrically connected to the connection pad 122, and a first coating layer 125 disposed on the passivation film 123 and covering at least a portion of a side surface of the first connection bump 124.

Meanwhile, a semiconductor package is manufactured by redistributing an integrated circuit in a bare die through a redistribution layer (RDL), and encapsulating it using an encapsulant. However, if a lower portion of a connection pad of a bare die is provided with a brittle pattern or is formed of an aluminum (Al) pad, vulnerable to shocks, when a probe test is directly executed on a connection pad, a damage to the connection pad may occur, which may be a direct cause of a defect rate. In this case, after a package is manufactured, it is necessary to filter off a defective product in a completion inspection test. However, as an inspection test is executed after packaging of an integrated circuit, which is already defective, is completed, there may be a problem in yield or process loss. Moreover, while a bare die is encapsulated using an encapsulant, the encapsulant may be bleeding, so a problem in which a connection pad is contaminated may occur.

On the other hand, the semiconductor package 100A according to an example may have a form in which a first connection bump 124 is further disposed on a connection pad 122 of the semiconductor chip 120, and a side surface of the first connection bump 124 is covered by the first coating layer 125 formed on the passivation film 123. In other words, the connection pad 122 is not directly exposed outside of the semiconductor chip 120, and thus damage to the connection pad 122 in a process of a probe test may be prevented. Moreover, a bleeding issue caused by the encapsulant 130 in a packaging process may be also prevented. In addition, since the first coating layer 125 holds the semiconductor chip 120, warpage or mechanical performance may be improved. Furthermore, a resin burr, which may occur when a plurality of semiconductor packages 100A are manufactured and then sawing in a single package in a substrate process, may be prevented.

Meanwhile, in the case of the semiconductor chip 120 of the semiconductor package 100A according to an example, a first connection bump 124 is not simply formed on a connection pad 122. Here, a first coating layer 125 capable of holding the first connection bump 124 is also formed on the passivation film 123. In this case, a grinding process is performed on the first connection bump 124 and the first coating layer 125, which will be described later. In this regard, even in the form of a packaged integrated circuit, an overall thickness may be reduced. Furthermore, a surface of the first connection bump 124 may be exposed, and thus may be easily connected even to the connection via 143.

In detail, the semiconductor chip 120 of the semiconductor package 100A according to an example may also be applied to the case of a packaged integrated circuit delivered after a redistribution layer (RDL) is formed in a chip scale on a connection pad of a bare die, and a solder bump is then formed thereabove. In detail, using a method of grinding the solder bump and the coating layer after a coating layer is formed on a passivation film of the corresponding packaged integrated circuit, the semiconductor chip 120, described above, may be implemented. In other words, the first connection bump 124 may include a low melting point metal, for example, a solder, having a melting point lower than that of a conductive material of the redistribution layer 142 or the connection via 143. Thus, the first connection bump may have a structure applied to a package die as well as a bare die, thereby having a wide versatility.

The respective components included in the fan-out semiconductor package 100A according to the exemplary embodiment will hereinafter be described in more detail.

The frame 110 may improve rigidity of the fan-out semiconductor package 100A depending on certain materials, and serve to secure uniformity of a thickness of the encapsulant 130. When wiring layers, wiring vias, and the like, are formed in the frame 110, to be described layer, the fan-out semiconductor package 100A may be utilized as a package-on-package (POP) type package. The frame 110 may have a through-hole 110H. The semiconductor chip 120 may be disposed in the through-hole 110H to be spaced apart from the frame 110 by a predetermined distance. Side surfaces of the semiconductor chip 120 may be surrounded by the frame 110. However, such a form is only an example and may be variously modified to have other forms, and another function may be performed depending on such a form. The frame 110 may be omitted if necessary, but the case having the frame 110 may be more advantageous in securing the board level reliability as intended in the present disclosure.

The frame 110 may include an insulating layer 111. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. When a material, having high rigidity, such as prepreg containing a glass fiber, is used, the frame 110 may be used as a supporting member for warpage control of the semiconductor package 100.

The semiconductor chip 120 may be an integrated circuit (IC) provided in an amount of several hundred to several million or more elements integrated in a single chip. In this case, the IC may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and the semiconductor chip may be a logic chip such as an analog-to-digital converter (ADC), an application-specific integrated circuit (ASIC), or the like, or a memory chip such as a volatile memory (for example, a dynamic random access memory (DRAM)), a non-volatile memory (for example, a read only memory (ROM)), a flash memory, or the like. Moreover, the IC may be a power management integrated circuit (PMIC), or the like. Moreover, these circuits related components are also combined.

The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide layer, a nitride layer, or the like, or a double layer of an oxide layer and a nitride layer.

A first connection bump 124 is disposed on the connection pad 122 of the semiconductor chip 120. The first connection bump 124 is in contact with an open surface of the connection pad 122 while filling the opening 123h of the passivation film 123 exposing at least a portion of the connection pad 122. The first connection bump 124 may extend to cover portions of the passivation layer 123 disposed on the electrode pad 122, and thus, the portions of the passivation layer 123 may extend between the connection pad 122 and the first connection bump 124. The first connection bump 124 may include a low melting point metal. The low melting point metal may include a material having a melting point lower than that of copper (Cu), such as tin (Sn) or an alloy including tin (Sn). For example, the first connection bump 124 may be a solder bump, but is not limited thereto. A first coating layer 125, covering at least a portion of a side surface of the first connection bump 124, may be disposed on the passivation film 123. The first coating layer 125 may include a known insulating material. For example, the insulating material may be polyimide (PI), a photoimageable dielectric (PID) material, and an Ajinomoto buildup film (ABF), but is not limited thereto. The first connection bump 124 may be formed by grinding and etching a solder ball, so a surface of the first connection bump 124, in contact with the first coating layer 125 of the first connection bump 124, may have a round shape.

On a surface of the first connection bump 124 of the semiconductor chip 120, in contact with the connection via 143 of the connection structure 140, a recess portion 124h opposing the body 121 may be formed. In other words, a surface of the first connection bump 124 of the semiconductor chip 120, in contact with the connection via 143 of the connection structure 140, and a surface of the first coating layer 125 of the semiconductor chip 120, in contact with the insulating layer 141 of the connection structure 140, may have a stepped portion. As described above, when a surface of the first connection bump 124 of the semiconductor chip 120 has a stepped portion, that is, a recess portion 124h, surface roughness is increased. The insulating layer 141 may have a protruding portion, having a shape corresponding to the recess portion 124h, protruding toward the electrode pad 122. Thus, adhesion with the insulating layer 141 of the connection structure 140 may be further improved. In addition, a thickness of the connection structure 140 may be thinner to a small degree.

A seed layer 145 may be disposed between the first connection bump 124 of the semiconductor chip 120 and the connection via 143 of the connection structure 140. The seed layer 145 may include at least one of titanium (Ti) or copper (Cu). The seed layer 145 may improve a bonding force between different materials. In other words, a bonding force between the first connection bump 124 of the semiconductor chip 120 and the connection via 143 of the connection structure 140 may be further improved by the seed layer 145. Meanwhile, the seed layer 145 may be a seed layer for formation of the redistribution layer 142 and the connection via 143. In other words, the seed layer 145 may be used as a seed layer 145 when copper (Cu) plating is performed for formation of the redistribution layer 142 and the connection via 143. In this case, in a manner different from that illustrated in the drawings, a seed layer 145 may be formed even on a surface of the insulating layer 141.

The encapsulant 130 may protect the frame 110, the semiconductor chip 120, and the like. An encapsulation form of the encapsulant is not particularly limited, but may be a form in which the encapsulant surrounds at least portions of the frame 110, the semiconductor chip 120, and the like. In this case, the encapsulant 130 may cover the frame 110 and an inactive surface of the semiconductor chip 120, and fill a space between a wall surface of the through-hole 110H and a side surface of the semiconductor chip 120. Meanwhile, the encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The connection structure 140 may redistribute the connection pads 122 of the semiconductor chip 120. Several tens to several hundreds of connection pads 122 of the semiconductor chip 120 having various functions may be redistributed by the connection structure 140, and may be physically or electrically externally connected through the electrical connection structures 170 depending on functions. The connection structure 140 may include insulating layers 141 disposed on the frame 110 and the active surface of the semiconductor chip 120, the redistribution layers 142 disposed on the insulating layers 141, and the connection vias 143 penetrating through the insulating layers 141 and electrically connecting the first connection bump 124 and the redistribution layers 142 to each other. The insulating layers 141, the redistribution layers 142, and the connection vias 143 may be composed of a larger number of layers than those illustrated in the drawings.

A material of each of the insulating layers 141 may be an insulating material. In this case, a photoimageable dielectric (PID) material may also be used as the insulating material. That is, the insulating layers 141 may be a photosensitive insulating layer. When the insulating layer 141 has photosensitive properties, a fine pitch of the connection via 143 may be achieved more easily. Even when the insulating layer 141 is a multilayer, each layer may have a boundary.

The redistribution layers 142 may substantially serve to redistribute the connection pads 122, and a formation material thereof may be a conductive material such as copper (Cu), aluminum (Al), silver (Ag), tin (Sn), gold (Au), nickel (Ni), lead (Pb), titanium (Ti), or alloys thereof. The redistribution layers may include copper (Cu). The redistribution layer 142 may perform various functions depending on a design of a corresponding layer. For example, the redistribution layer may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the signal (S) patterns may include via pad patterns, electrical connection structure pad patterns, and the like.

The connection vias 143 may electrically connect the redistribution layers 142, the connection pads 122, and the like, formed on different layers, to each other, resulting in an electrical path in the fan-out semiconductor package 100A. A material of each of the connection vias 143 may be a conductive material such as copper (Cu), aluminum (Al), silver (Ag), tin (Sn), gold (Au), nickel (Ni), lead (Pb), titanium (Ti), or alloys thereof. Preferably, the connection vias may include copper (Cu). Each of the connection vias 143 may be completely filled with the conductive material, or the conductive material may be formed along a wall of each of via holes. Moreover, a tapered shape may be applied thereto.

The passivation layer 150 may protect the connection structure 140 from external physical or chemical damage. The passivation layer 150 may have openings 151 exposing at least portions of the redistribution layer 142 of the connection structure 140. The number of openings 151 formed in the passivation layer 150 may be several tens to several thousands. A material of the passivation layer 150 is not particularly limited. For example, an insulating material may be used as the material of the passivation layer. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layer 160 may improve connection reliability of the electrical connection structure 170 to improve board level reliability of the fan-out semiconductor package 100A. The underbump metal layer 160 may be connected to the redistribution layer 142 of the connection structure 140 exposed through the openings 151 of the passivation layer 150. The underbump metal layer 160 may be formed in the openings 151 of the passivation layer 150 by any known metallization method using any known conductive metal such as a metal, but is not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. The electrical connection structure 170 may be formed of a low melting point metal, for example, tin (Sn) or an alloy including tin (Sn). In more detail, the electrical connection structure may be formed of a solder, or the like. However, this is only an example, and a material of the electrical connection structure is not particularly limited thereto. Each of the electrical connection structures 170 may be a land, a ball, a pin, or the like. The electrical connection structures 170 may be formed as a multilayer or single layer structure. When the electrical connection structure includes the plurality of layers, the electrical connection structure includes a copper pillar and a solder. When the electrical connection structure includes the single layer, the electrical connection structure includes a tin-silver solder or copper. However, the electrical connection structure is only an example, and the present disclosure is not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metal layer 160 extending onto one surface of the passivation layer 150, and connection reliability may be more excellent. At least one of the electrical connection structures 170 may be disposed in a fan-out region. The fan-out region refers to a region except for a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the wall surface of the through-hole 110H for the purpose of radiating heat and/or shielding electromagnetic waves, if necessary. Moreover, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. Moreover, if necessary, a passive component, such as a surface mount (SMT) component including, for example, an inductor, a capacitor, and the like, may be disposed on a surface of the passivation layer 150.

Figure 11:
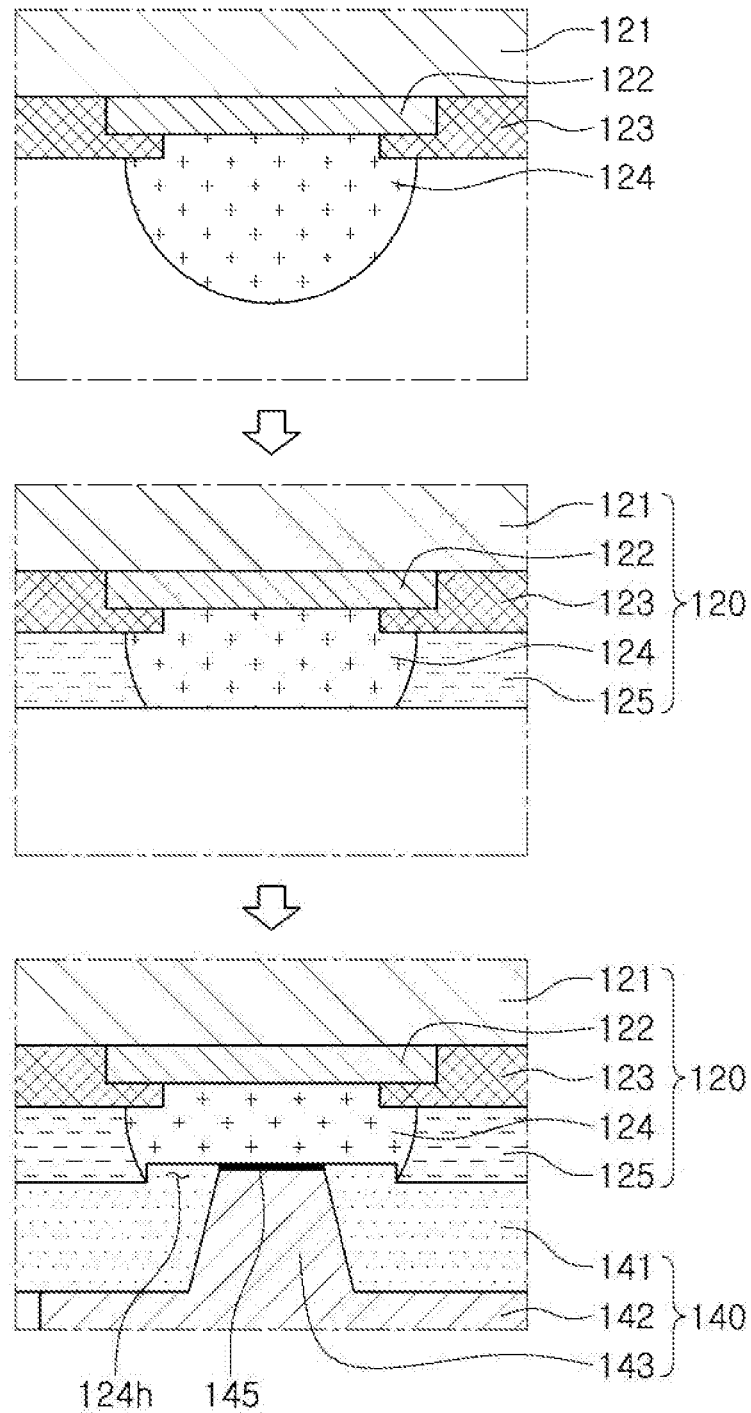
FIG. 11 is a schematically process chart illustrating a process of forming a connection structure on a semiconductor chip of the semiconductor package of FIG. 9.

FIG. 11 is a schematic process chart illustrating a process of forming a connection structure on a semiconductor chip of the semiconductor package of FIG. 9.

Referring to FIG. 11, first, a semiconductor chip 120 is provided. The semiconductor includes a passivation film 123 having an opening 123h, exposing at least a portion while covering at least a portion of the connection pad 122 on an active surface of the body 121, on which the connection pad 122 is disposed. The semiconductor also includes a first connection bump 124 disposed in an opening 123h of the passivation film 123 and connected to a connection pad 122 which is open through the opening 123h of the passivation film 123. The connection pad 122 is blocked by the first connection bump 124, thereby preventing damage in a probe test, and preventing contamination caused by resin bleeding. The first connection bump 124 covers portions of the passivation layer 123 disposed on the electrode pad 122, and thus, the portions of the passivation layer 123 extend between the connection pad 122 and the first connection bump 124.

Next, a first coating layer 125, covering the first connection bump 124, is formed on the passivation film 123. The first coating layer 125 may be formed by a known coating process or lamination process using PI, PID, ABF, or the like. Then, a grinding process is performed so that a surface of the first connection bump 124 is exposed from the first coating layer 125. As described above, a grinding process is performed while the first connection bump 124 is held by the first coating layer 125. In this regard, even when the semiconductor chip 120 is in a packaged state, the first connection bump may be easily embedded in the fan-out semiconductor package 100A, in a manner similar to a bare die. Moreover, as the grinding process is performed, a thickness thereof may be reduced.

Then, a recess portion 124h is formed on a surface of the first connection bump 124 using an etching process, or the like, as necessary. Then, an insulating layer 141 is formed in a coating process or a lamination process using PID on the first connection bump 124 and the first coating layer 125, a via hole is formed in the insulating layer 141 using a photolithography process, a redistribution layer 142 and a connection via 143 are formed using a plating process, resulting in forming a connection structure 140 on the active surface of the semiconductor chip 120. A separate seed layer 145 may be formed on a surface of the first connection bump 124 first to improve a bonding force. In this case, the seed layer 145 may be used as a base seed layer for plating of the redistribution layer 142 and the connection via 143.

Figure 12:
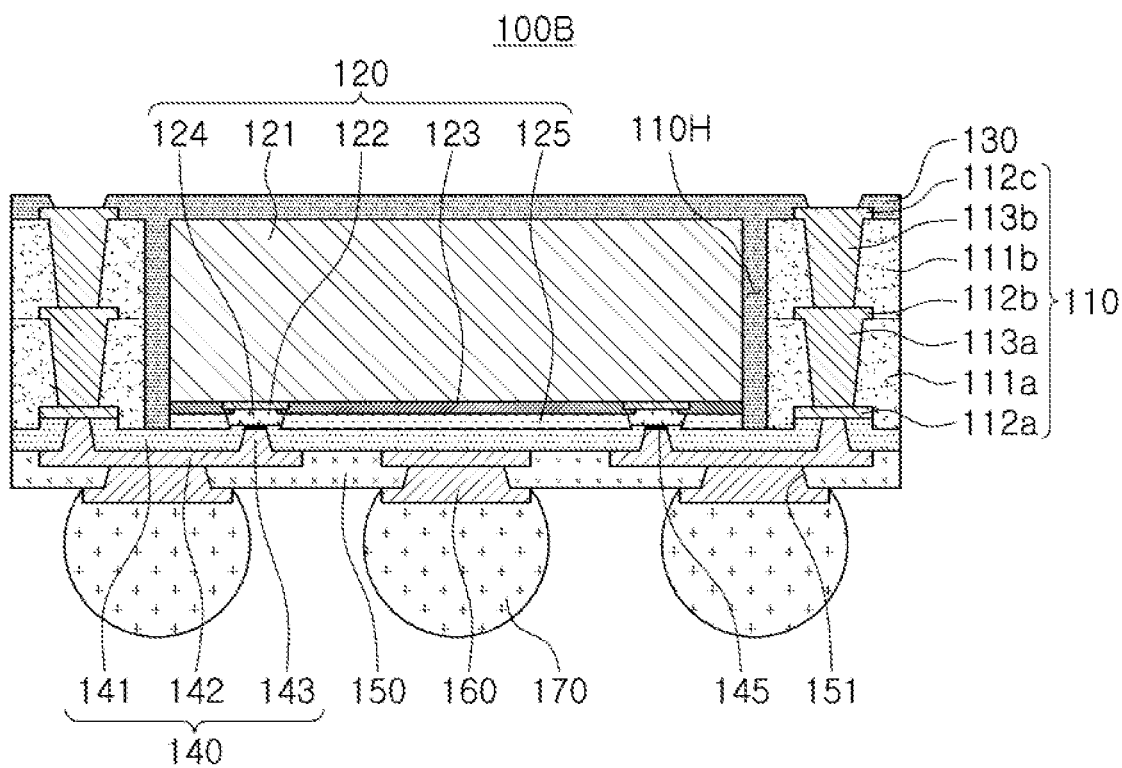
FIG. 12 is a schematic cross-sectional view illustrating another example of a semiconductor package.

FIG. 12 is a schematic cross-sectional view illustrating another example of a fan-out semiconductor package.

Referring to FIG. 12, in a fan-out semiconductor package 100B according to another example, a frame 110 may include a first insulating layer 111a in contact with the insulating layer 141, a first wiring layer 112a in contact with the insulating layer 141 and embedded in the first insulating layer 111a, a second wiring layer 112b disposed on a side opposing a side in which the first wiring layer 112a of the first insulating layer 111a is embedded, a second insulating layer 111b disposed on a side opposing a side in which the first wiring layer 112a of the first insulating layer 111a is embedded and covering at least a portion of the second wiring layer 112b, and a third wiring layer 112c disposed on a side opposing a side in which the second wiring layer 112b of the second insulating layer 111b is embedded. The first to third wiring layers 112a, 112b, and 112c are electrically connected to the connection pad 122. Since the frame 110 may include a large number of wiring layers 112a, 112b, 112c, and 112d, a connection structure 140 may be simplified. Therefore, a decrease in a yield depending on a defect occurring in a process of forming the connection structure 140 may be suppressed. The first wiring layer 112a and the second wiring layer 112b, as well as the second wiring layer 112b and the third wiring layer 112c may be electrically connected to each other through the first wiring via 113a and the second wiring via 113b, passing through the first insulating layer 111a and the second insulating layer 111b, respectively.

When the first wiring layer 112a is embedded in the first insulating layer 111a, a step generated due to a thickness of the first wiring layer 112a may be significantly reduced, and an insulating distance of the connection structure 140 may thus become constant. Thus, high-density wiring design of the connection structure 140 may be easily performed. The first wiring layer 112a may be recessed inwardly of the first insulating layer 111a. That is, the first wiring layer 112a may be recessed in the first insulating layer 111a, such that a lower surface of the first insulating layer 111a and a lower surface of the first wiring layer 112a may have a step therebetween. In this case, a phenomenon in which a material of an encapsulant 130 bleeds to pollute the first wiring layer 112a may be prevented. The second wiring layer 112b of the frame 110 may be disposed on a level between an active surface and an inactive surface of the semiconductor chip 120.

A thickness of each of the wiring layers 112a, 112b, and 112c of the frame 110 may be greater than that of each of the redistribution layers 142 of the connection structure 140. The frame 110 may have a thickness larger than that of the semiconductor chip 120, so the wiring layers 112a, 112b, and 112c may also be formed in a larger size to match the scale thereof. On the other hand, the redistribution layer 142 of the connection structure 140 may be formed in a relatively smaller size than that of the wiring layers 112a, 112b, and 112c for thinning.

A material of each of the insulating layers 111a and 111b is not particularly limited. For example, an insulating material may be used as the material of the insulating layer. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 122 of the semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layer may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers may include via pads, wire pads, electrical connection structure pads, and the like.

The wiring vias 113a and 113b may electrically connect the wiring layers 112a, 112b, and 112c formed on different layers to each other, resulting in an electrical path in the frame 110. A material of each of the wiring vias 113a and 113b may be a conductive material. Each of the wiring vias 113a and 113b may be completely filled with the conductive material, or the conductive material may be formed along a wall of each of via holes. In addition, the wiring vias may have a tapered shape. When a hole for the first wiring via 113a is formed, some pads of the first wiring layer 112a may serve as a stopper. In this regard, it may be advantageous in a process in that the first wiring via 113a has a tapered shape in which a width of an upper surface is greater than a width of a lower surface. In this case, the first wiring via 113a may be integrated with a pad pattern of the second wiring layer 112b. When a hole for the second wiring via 113b is formed, some pads of the second wiring layer 112b may serve as a stopper. In this regard, it may be advantageous in a process in that the second wiring via 113b has a tapered shape in which a width of an upper surface is greater than a width of a lower surface. In this case, the second wiring via 113*b* may be integrated with a pad pattern of the third wiring layer 112*c*.

Other components, for example, those described with reference to FIGS. 9 to 11, may also be applied to the fan-out semiconductor package 100B according to another example, and a detailed description is substantially the same as that described in the fan-out semiconductor package 100A described above, and the detailed description will be omitted.

Figure 13:
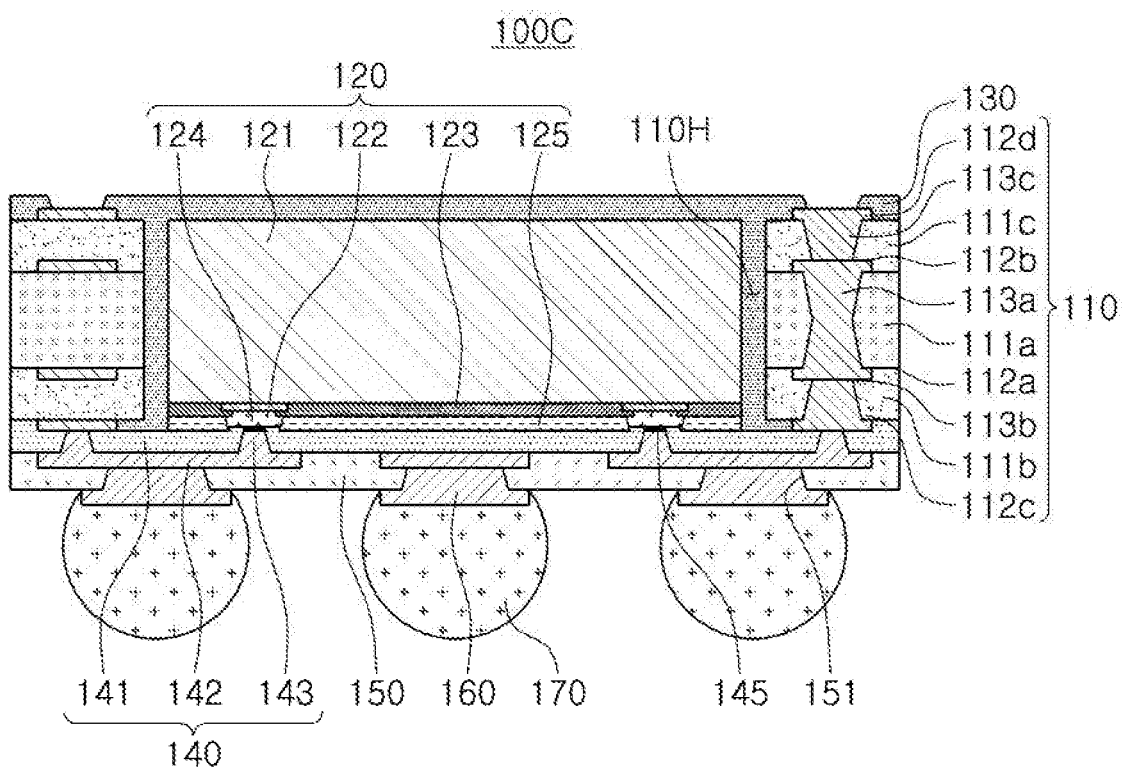
FIG. 13 is a schematic cross-sectional view illustrating another example of a semiconductor package.

FIG. 13 is a schematic cross-sectional view illustrating another example of a fan-out semiconductor package.

Referring to FIG. 13, in a fan-out semiconductor package 100C according to another example, a frame 110 may include a first insulating layer 111*a*, a first wiring layer 112*a* and a second wiring layer 112*b* disposed on one side and the other side of the first insulating layer 111*a*, respectively, a second insulating layer 111*b* disposed on one side of the first insulating layer 111*a* and covering at least a portion of the first wiring layer 112*a*, a third redistribution layer 112*c* disposed on a side opposing a side in which the first wiring layer 112*a* of the second insulating layer 111*b* is embedded, a third insulating layer 111*c* disposed on the other side of the first insulating layer 111*a* and covering at least a portion of the second wiring layer 112*b*, and a fourth wiring layer 112*d* disposed on a side opposing a side in which second wiring layer 112*b* of the third insulating layer 111*c* is embedded. The first to fourth wiring layers 112*a*, 112*b*, 112*c*, and 112*d* may be electrically connected to connection pads 122. Since the frame 110 may include a further large number of wiring layers 112*a*, 112*b*, 112*c*, and 112*d*, a connection structure 140 may be further simplified. Therefore, a decrease in a yield depending on a defect occurring in a process of forming the connection structure 140 may be suppressed. Meanwhile, the first to fourth wiring layers 112*a*, 112*b*, 112*c*, and 112*d* may be electrically connected to each other through first to third wiring vias 113*a*, 113*b*, and 113*c* passing through the first to third insulating layers 111*a*, 111*b*, and 111*c*, respectively.

The first insulating layer 111*a* may have a thickness greater than those of the second insulating layer 111*b* and the third insulating layer 111*c*. The first insulating layer 111*a* may be basically relatively thick in order to maintain rigidity, and the second insulating layer 111*b* and the third insulating layer 111*c* may be introduced in order to form a larger number of wiring layers 112*c* and 112*d*. The first insulating layer 111*a* may include an insulating material different from those of the second insulating layer 111*b* and the third insulating layer 111*c*. For example, the first insulating layer 111*a* may be, for example, prepreg including a core material, a filler, and an insulating resin, and the second insulating layer 111*b* and the third insulating layer 111*c* may be ABF or PID including a filler and an insulating resin. However, the materials of the first insulating layer 111*a* and the second and third insulating layers 111*b* and 111*c* are not limited thereto. Similarly, the first wiring via 113*a* passing through the first insulating layer 111*a* may have a diameter greater than those of the second and third wiring vias 113*b* and 113*c* passing through the second and third insulating layers 111*b* and 111*c*, respectively.

The first wiring layer 112*a* and the second wiring layer 112*b* of the frame 110 may be disposed on a level between an active surface and an inactive surface of the semiconductor chip 120. A thickness of each of the wiring layers 112*a*, 112*b*, 112*c*, and 112*d* of the frame 110 may be greater than that of each of the redistribution layers 142 of the connection structure 140. The second wiring via 113*b* and the third wiring via 113*c* may have tapered shapes in opposite directions with respect to the first connection via 113*a*.

Other components, for example, those described with reference to FIGS. 9 to 12, may also be applied to the fan-out semiconductor package 100C according to another example, and a detailed description is substantially the same as that described in the fan-out semiconductor packages 100A and 100B described above, and the detailed description will be omitted.

Figure 14:
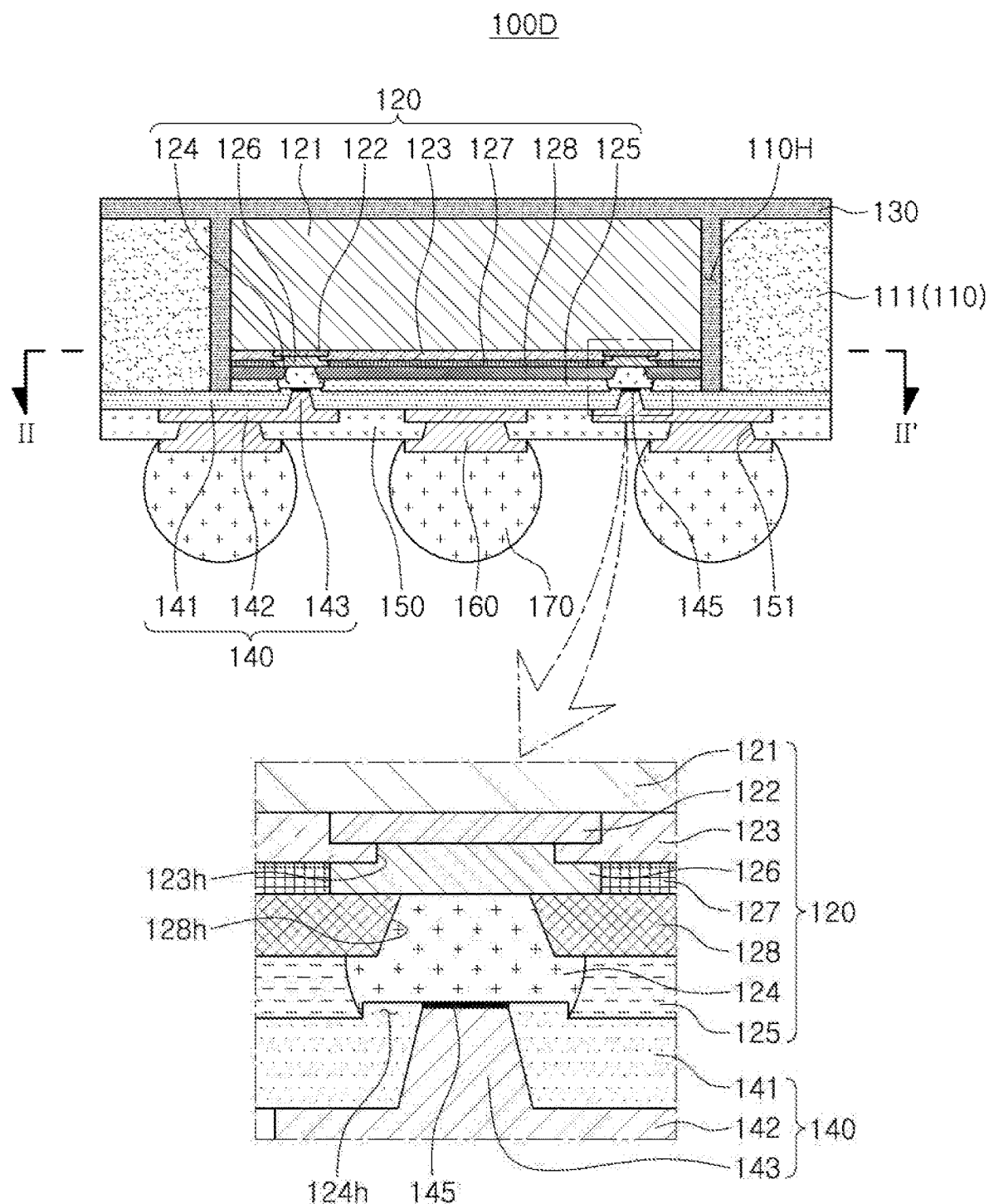
FIG. 14 is a schematic cross-sectional view illustrating another example of a semiconductor package.

FIG. 14 is a schematic cross-sectional view illustrating another example of a semiconductor package.

Figure 15:
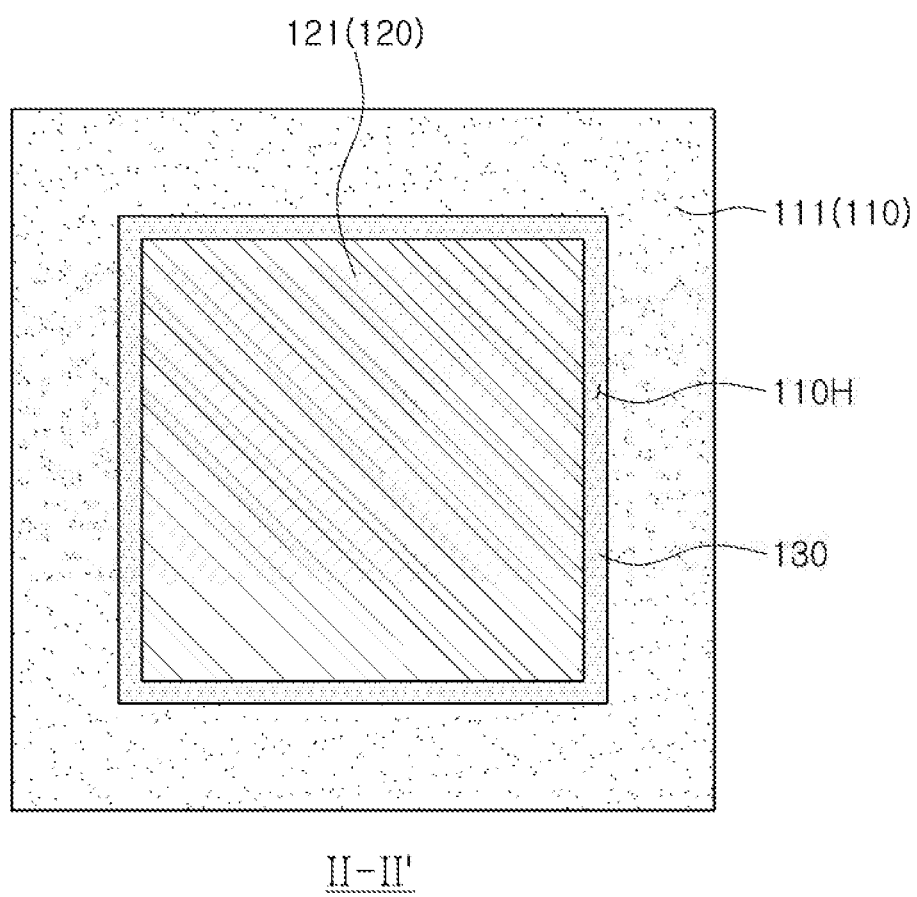
FIG. 15 is a schematic plan view taken along line II-II' of the semiconductor package of FIG. 14.

FIG. 15 is a schematic plan view taken along line II-II' of the semiconductor package of FIG. 14.

Referring to FIG. 14, in a fan-out semiconductor package 100D according to another example, a semiconductor chip 120 may include a body 121 having an active surface on which a connection pad 122 is disposed and an inactive surface opposing the active surface, a passivation film 123 disposed on the active surface of the body 121 and covering at least a portion of the connection pad 122, a first connection bump 124 disposed on the passivation film 123 and electrically connected to the connection pad 122, a first coating layer 125 disposed on the passivation film 123 and covering at least a portion of a side surface of the first connection bump 124, a second connection bump 126 disposed between the connection pad 122 and the first connection bump 124 and electrically connecting the connection pad 122 to the first connection bump 124, a second coating layer 127 disposed on the passivation film 123 and covering at least a portion of a side surface of the second connection bump 126, and an intermediate layer 128 disposed between the second coating layer 127 and the first coating layer 125 and covering at least a portion of a side surface of the first connection bump 124. In other words, the semiconductor chip 120 may have a more specific packaged-die shape.

The first and second connection bumps 124 and 126 include different materials. For example, the first connection bump 124 may include a low melting point metal, the second connection bump 126 may include a conductive material, and the low melting point metal may have a melting point lower than that of the conductive material. The low melting point metal may be tin (Sn) or an alloy containing tin (Sn). The conductive material may include copper (Cu). In detail, the first connection bump 124 may be a solder bump including a solder, while the second connection bump 126 may be a copper bump including copper (Cu). In other words, the semiconductor chip 120 may be processed according to an example while having a basic structure of a packaged die in which a redistribution layer (not shown) is formed by a medium of the copper bump 126 on the active surface of the body 121, and a solder bump 124 in the form of a solder ball is formed in a redistribution layer (not shown) for connection with the outside.

A surface of the second connection bump 126, in contact with the first connection bump 124 may be coplanar with a surface of the second coating layer 127, in contact with the intermediate layer 128. In other words, they may be provided on the substantially same plane. In this regard, after a second coating layer 127 for covering the first connection bump 124 is formed, a grinding process is performed to open a surface of the first connection bump 124. As a result, a thickness may be significantly reduced, and a flat surface for formation of the intermediate layer 128 may be provided. Thus, various advantages on a process may be provided.

The passivation film 123 may have an opening 123*h*, exposing at least a portion of a surface of the connection pad 122, in contact with the second connection bump 126, and the second connection bump 126 may fill the opening 123*h*. The second connection bump 126 may extend to cover portions of the passivation layer 123 disposed on the electrode pad 122, and thus, the portions of the passivation layer 123 may extend between the connection pad 122 and the second connection bump 126. Moreover, the intermediate layer 128 may have an opening 128*h*, exposing at least a portion of a surface of the second connection bump 126, in contact with the first connection bump 124, and the first connection bump 124 may fill the opening 128*h*. The first connection bump 124 may extend to cover portions of the intermediate layer 128 disposed on the second connection bump 126, and thus, the portions of the intermediate layer 128 may extend between the first connection bump 124 and the second connection bump 126. In this regard, an electrical connection path having excellent reliability and low signal loss may be provided.

The first coating layer 125 may include a known insulating material. For example, the insulating material may be polyimide (PI), a photoimageable dielectric (PID) material, and an Ajinomoto buildup film (ABF), but is not limited thereto. The intermediate layer 128 may also include a known insulating material. For example, the insulating material may be polyimide (PI), a photoimageable dielectric (PID) material, and an Ajinomoto buildup film (ABF), but is not limited thereto. The first coating layer 125 and the second coating layer 127 may include the same insulating material, and may include an insulating material different from that of the intermediate layer 128. The intermediate layer 128 may include an insulating material the same as that of the insulating layer 141 of the connection structure 140, for example, a photoimageable dielectric (PID) material. A side surface of the first connection bump 124, covered by the intermediate layer 128, may have a tapered shape in a direction opposing a side surface of the first connection bump, covered by the first coating layer 125.

Other components, for example, those described with reference to FIGS. 9 to 13, may also be applied to the fan-out semiconductor package 100D according to another example, and a detailed description is substantially the same as that described in the fan-out semiconductor packages 100A, 100B, and 100C described above, and the detailed description will be omitted.

Figure 16:
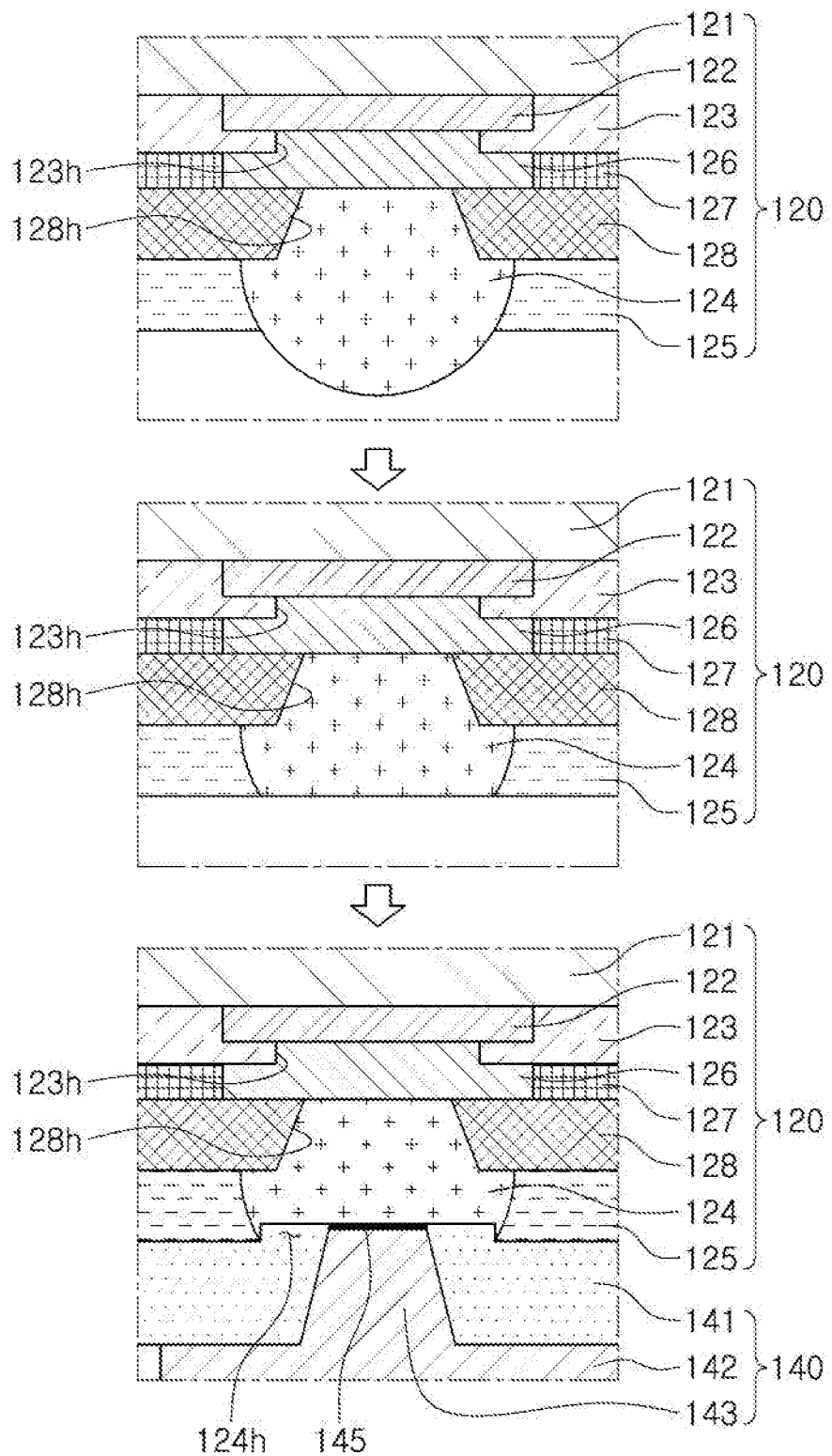
FIG. 16 is a schematic process chart illustrating a process of forming a connection structure on a semiconductor chip of the semiconductor package of FIG. 14.

FIG. 16 is a schematic process chart illustrating a process of forming a connection structure on a semiconductor chip of the semiconductor package of FIG. 14.

Referring to FIG. 16, a semiconductor chip 120 is provided first. The semiconductor chip includes a passivation film 123 having an opening 123*h*, exposing at least a portion, and covering at least a portion of the connection pad 122 on the active surface of the body 121, on which the connection pad 122 is disposed, includes a second connection bump 126 disposed in the opening 123*h* of the passivation film 123 and connected to the connection pad 122 open through the opening 123*h* of the passivation film 123, includes a second coating layer 127 disposed on the passivation film 123 and covering at least a portion of a side surface of the second connection bump 126, includes an intermediate layer 128 disposed on the second coating layer 127, covering at least a portion of the second connection bump 126, and having an opening 128*h*, exposing at least a portion, and includes a first connection bump 124 disposed in the opening 128*h* of the intermediate layer 128, and connected to the second connection bump 126, open through the opening 128*h* of the intermediate layer 128. The connection pad 122 is blocked by the first connection bump 124 and the second connection bump 126, thereby preventing damage in a probe test, and preventing contamination caused by resin bleeding.

Next, a first coating layer 125, covering the first connection bump 124, is formed on the intermediate layer 128. The first coating layer 125 may be formed by a known coating process or lamination process using PI, PID, ABF, or the like. Then, a grinding process is performed so that a surface of the first connection bump 124 is exposed. As described above, a grinding process is performed while the first connection bump 124 is hold by the first coating layer 125. Here, even when the semiconductor chip 120 is in a packaged state, the semiconductor chip may be easily embedded in the fan-out semiconductor package 100A, in a manner similar to a bare-die. Moreover, as the grinding process is performed, a thickness thereof may be reduced.

Then, a recess portion 124*h* is formed on a surface of the first connection bump 124 using an etching process, or the like, as necessary. Then, an insulating layer 141 is formed in a coating process or a lamination process using PID on the first connection bump 124 and the first coating layer 125, a via hole is formed in the insulating layer 141 using a photolithography process, a redistribution layer 142 and a connection via 143 are formed using a plating process, resulting in forming a connection structure 140 on the active surface of the semiconductor chip 120. A separate seed layer 145 may be formed on a surface of the first connection bump 124 first to improve a bonding force. In this case, the seed layer 145 may be used as a base seed layer for plating of the redistribution layer 142 and the connection via 143.

Figure 17:
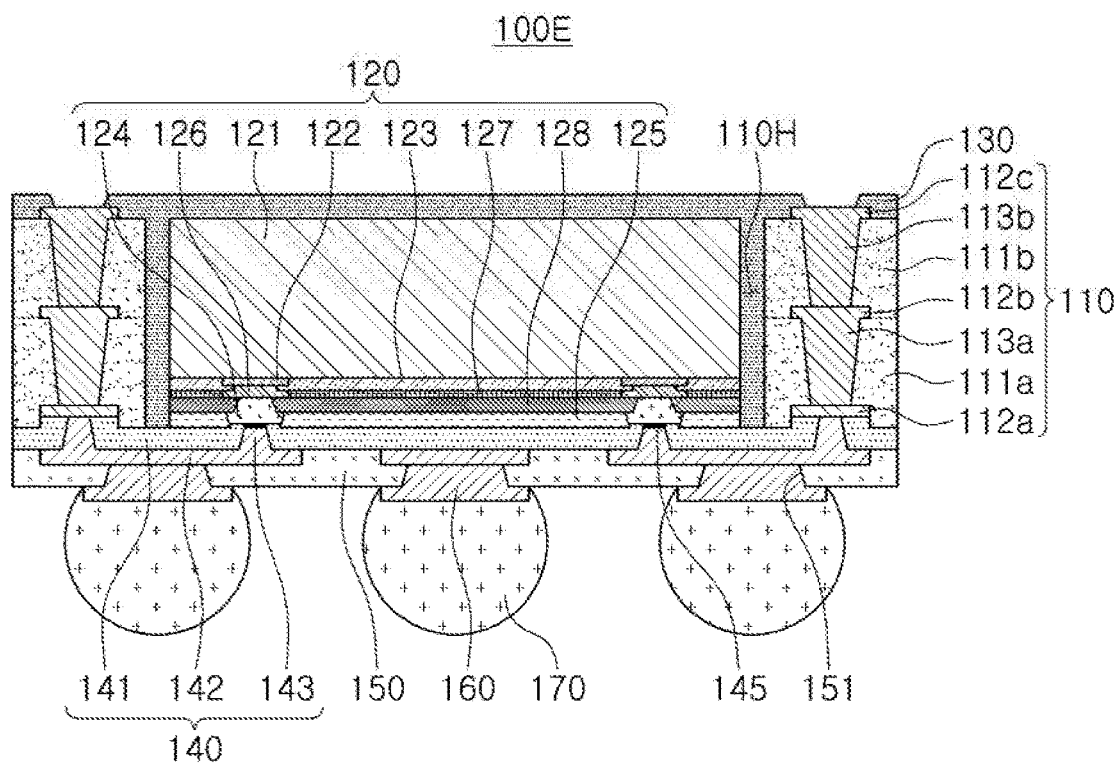
FIG. 17 is a schematic cross-sectional view illustrating another example of a semiconductor package.

FIG. 17 is a schematic cross-sectional view illustrating another example of a semiconductor package.

Referring to FIG. 17, in a fan-out semiconductor package 100E according to another example, the frame 110 may include a first insulating layer 111*a* in contact with the insulating layer 141, a first wiring layer 112*a* in contact with the insulating layer 141 and embedded in the first insulating layer 111*a*, a second wiring layer 112*b* disposed on a side opposing a side in which the first wiring layer 112*a* of the first insulating layer 111*a* is embedded, a second insulating layer 111*b* disposed on a side opposing a side in which the first wiring layer 112*a* of the first insulating layer 111*a* is embedded and covering at least a portion of the second wiring layer 112*b*, and a third wiring layer 112*c* disposed on a side opposing a side in which the second wiring layer 112*b* of the second insulating layer 111*b* is embedded. The first to third wiring layers 112*a*, 112*b*, and 112*c* are electrically connected to the connection pad 122. The first wiring layer 112*a* and the second wiring layer 112*b*, as well as the second wiring layer 112*b* and the third wiring layer 112*c* may be electrically connected to each other through the first wiring via 113*a* and the second wiring via 113*b*, passing through the first insulating layer 111*a* and the second insulating layer 111*b*, respectively.

Other components, for example, those described with reference to FIGS. 9 to 16, may also be applied to the fan-out semiconductor package 100E according to another example, and a detailed description is substantially the same as that described in the fan-out semiconductor packages 100A, 100B, 100C and 100D described above, and the detailed description will be omitted.

Figure 18:
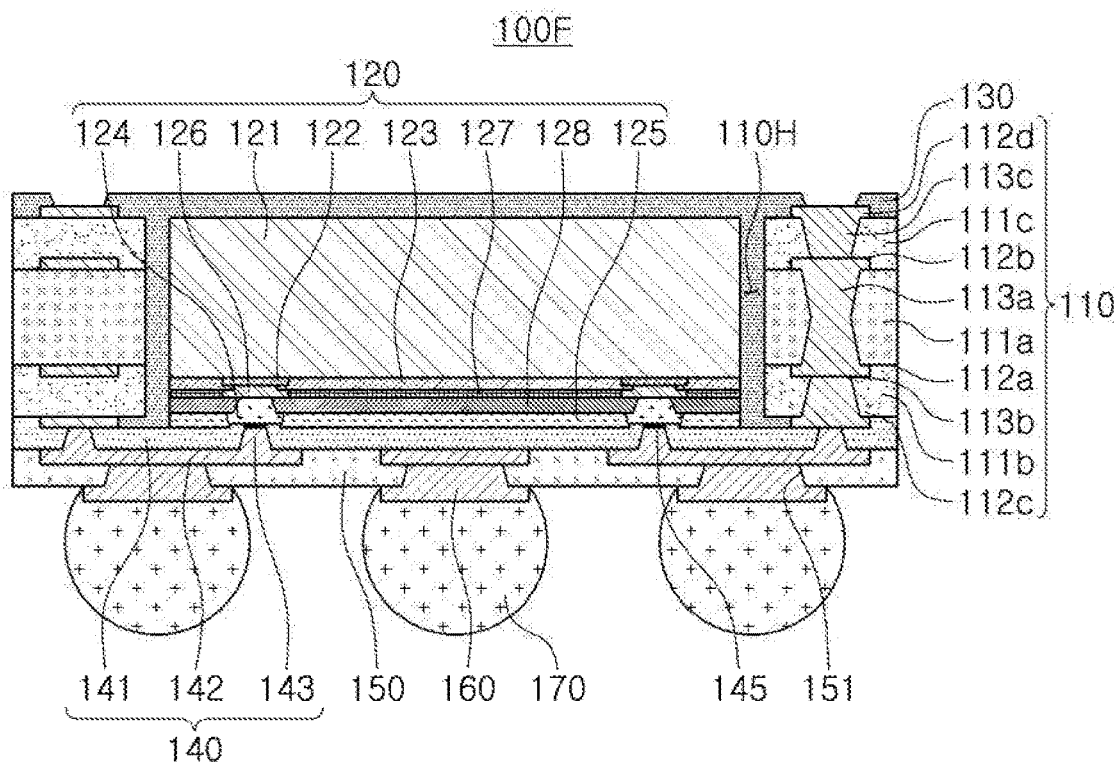
FIG. 18 is a schematic cross-sectional view illustrating another example of a semiconductor package.

FIG. 18 is a schematic cross-sectional view illustrating another example of a semiconductor package.

Referring to FIG. 18, in a fan-out semiconductor package 100F according to another example, the frame 110 may include a first insulating layer 111*a* in contact with the insulating layer 141, a first wiring layer 112*a* and a second wiring layer 112*b* disposed on one side and the other side of the first insulating layer 111a, respectively, a second insulating layer 111b disposed on one side of the first insulating layer 111a and covering at least a portion of the first wiring layer 112a, a third redistribution layer 112c disposed on a side opposing a side in which the first wiring layer 112a of the second insulating layer 111b is embedded, a third insulating layer 111c disposed on the other side of the first insulating layer 111a and covering at least a portion of the second wiring layer 112b, and a fourth wiring layer 112d disposed on a side opposing a side in which second wiring layer 112b of the third insulating layer 111c is embedded. The first to fourth wiring layers 112a, 112b, 112c, and 112d may be electrically connected to connection pads 122. Meanwhile, the first to fourth wiring layers 112a, 112b, 112c, and 112d may be electrically connected to each other through first to third wiring vias 113a, 113b, and 113c passing through the first to third insulating layers 111a, 111b, and 111c, respectively.

Other components, for example, those described with reference to FIGS. 9 to 17, may also be applied to the fan-out semiconductor package 100F according to another example, and a detailed description is substantially the same as that described in the fan-out semiconductor packages 100A, 100B, 100C, 100D and 100E described above, and the detailed description will be omitted.

As set forth above, according to an exemplary embodiment, even when a semiconductor chip in a state of a packaged integrated circuit is packaged, a semiconductor package having a new structure, capable of reducing a thickness and easily forming a redistribution layer (RDL) on an active surface of the semiconductor chip, may be provided. Moreover, when a semiconductor chip, processed in the form of a packaged integrated circuit, is embedded in a semiconductor package and packaged, a probe test may be easily performed without damage to the connection pad. In addition, a contamination problem of a connection pad caused by resin bleeding of an encapsulant in a packaging process may be also prevented.

While exemplary embodiments have been shown and described above, it will be apparent to those skilled in the art that modifications and variations could be made without departing from the scope of the present invention as defined by the appended claims.

What is claimed is:

1. A semiconductor package, comprising:
a semiconductor chip including a body having an active surface on which a connection pad is disposed and an inactive surface opposing the active surface, a passivation film disposed on the active surface of the body and covering at least a portion of the connection pad, a first connection bump disposed on the passivation film and electrically connected to the connection pad, and a first coating layer disposed on the passivation film and covering at least a portion of a side surface of the first connection bump;
an encapsulant covering at least a portion of the semiconductor chip; and
a connection structure including an insulating layer disposed on the first coating layer of the semiconductor chip, a redistribution layer disposed on the insulating layer, and a connection via passing through the insulating layer and electrically connecting the first connection bump to the redistribution layer,
wherein the first connection bump includes a low melting point metal,
the redistribution layer and the connection via include a conductive material,
the low melting point metal has a melting point lower than a melting point of the conductive material,
the first connection bump has a recess portion toward the body in a lower surface of the first connection bump, in contact with the connection via, and
the recess portion extends to an entire region of the lower surface exposed through the first coating layer.

2. The semiconductor package of claim 1, wherein the low melting point metal includes a solder, and
the conductive material includes copper (Cu).

3. The semiconductor package of claim 1, wherein a surface of the first connection bump, in contact with the connection via, and a surface of the first coating layer, in contact with the insulating layer, have a step.

4. The semiconductor package of claim 1, wherein the side surface of the first connection bump, in contact with the first coating layer, has a round shape.

5. The semiconductor package of claim 1, further comprising a seed layer disposed between the first connection bump and the connection via,
wherein the seed layer includes at least one of titanium (Ti) and copper (Cu).

6. The semiconductor package of claim 1, wherein the semiconductor chip further includes a second connection bump disposed between the connection pad and the first connection bump and electrically connecting the connection pad to the first connection bump, a second coating layer disposed on the passivation film and covering at least a portion of a side surface of the second connection bump, and an intermediate layer disposed between the second coating layer and the first coating layer and covering at least a portion of the first connection bump, and
the first connection bump and the second connection bump include different materials.

7. The semiconductor package of claim 6, wherein a surface of the second connection bump, in contact with the first connection bump, is coplanar with a surface of the second coating layer, in contact with the intermediate layer.

8. The semiconductor package of claim 6, wherein the second connection bump fills an opening of the passivation film exposing at least a portion of a surface of the connection pad, in contact with the second connection bump, and
the first connection bump fills an opening of the intermediate layer exposing at least a portion of a surface of the second connection bump, in contact with the first connection bump.

9. The semiconductor package of claim 6, wherein
the second connection bump includes a conductive material, and
the low melting point metal has the melting point lower than a melting point of the conductive material of the second connection bump.

10. The semiconductor package of claim 9, wherein the low melting point metal includes a solder, and
the conductive material of the second connection bump includes copper (Cu).

11. The semiconductor package of claim 6, wherein portions of the passivation film extend between the connection pad and the second connection bump, and
portions of the intermediate layer extend between the second connection bump and the first connection bump.

12. The semiconductor package of claim 1, further comprising: a frame having a through-hole,
wherein the semiconductor chip is disposed in the through-hole, and
the encapsulant fills at least a portion of the through-hole.

13. The semiconductor package of claim 12, wherein the frame includes a first insulating layer in contact with the insulating layer, a first wiring layer in contact with the insulating layer and embedded in the first insulating layer, a second wiring layer disposed on a side of the first insulating layer opposing a side in which the first wiring layer is embedded, a first wiring via passing through the first insulating layer and electrically connecting the first wiring layer to the second wiring layer, a second insulating layer disposed on the side of the first insulating layer opposing the side in which the first wiring layer is embedded and covering at least a portion of the second wiring layer, a third wiring layer disposed on a side of the second insulating layer opposing a side in which the second wiring layer is embedded, and a second wiring via passing through the second insulating layer and electrically connecting the second wiring layer to the third wiring layer, and the first to third wiring layers are electrically connected to the connection pad.

14. The semiconductor package of claim 12, wherein the frame includes a first insulating layer, a first wiring layer disposed on one side of the first insulating layer, a second wiring layer disposed on the other side of the first insulating layer, a first wiring via passing through the first insulating layer, a second insulating layer disposed on the one side of the first insulating layer and covering at least a portion of the first wiring layer, a third wiring layer disposed on a side of the second insulating layer opposing a side in which the first wiring layer is embedded, a second wiring via passing through the second insulating layer and electrically connecting the first wiring layer to the third wiring layer, a third insulating layer disposed on the other side of the first insulating layer and covering at least a portion of the second wiring layer, a fourth wiring layer disposed on a side of the third insulating layer opposing a side in which the second wiring layer is embedded, and a third wiring via passing through the third insulating layer and electrically connecting the second wiring layer to the fourth wiring layer, and the first to the fourth wiring layers are electrically connected to the connection pad.

15. The semiconductor package of claim 1, wherein portions of the passivation film extend between the connection pad and the first connection bump.

16. A semiconductor package, comprising: a semiconductor chip including a body having an active surface on which a connection pad is disposed and an inactive surface opposing the active surface, a passivation film disposed on the active surface of the body and covering at least a portion of the connection pad, a first connection bump disposed on the passivation film and electrically connected to the connection pad, a first coating layer disposed on the passivation film and covering at least a portion of a side surface of the first connection bump, a second connection bump disposed between the connection pad and the first connection bump and electrically connecting the connection pad to the first connection bump, a second coating layer disposed on the passivation film and covering at least a portion of a side surface of the second connection bump, and an intermediate layer disposed between the second coating layer and the first coating layer and covering at least a portion of the first connection bump;

an encapsulant covering at least a portion of the semiconductor chip; and a connection structure including an insulating layer disposed on the first coating layer of the semiconductor chip, a redistribution layer disposed on the insulating layer, and a connection via passing through the insulating layer and electrically connecting the first connection bump to the redistribution layer, wherein the first connection bump and the second connection bump include different materials.

17. A semiconductor package, comprising:

a semiconductor chip including a body having an active surface on which a connection pad is disposed and an inactive surface opposing the active surface, a passivation film disposed on the active surface of the body and covering at least a portion of the connection pad, a first connection bump disposed on the passivation film and electrically connected to the connection pad, a first coating layer disposed on the passivation film and covering at least a portion of a side surface of the first connection bump, a second connection bump disposed between the connection pad and the first connection bump and electrically connecting the connection pad to the first connection bump, and a second coating layer disposed on the passivation film and covering at least a portion of a side surface of the second connection bump;

an encapsulant covering at least a portion of the semiconductor chip; and a connection structure including an insulating layer disposed on the first coating layer of the semiconductor chip, a redistribution layer disposed on the insulating layer, and a connection via passing through the insulating layer and electrically connecting the first connection bump to the redistribution layer, wherein the first connection bump includes a low melting point metal, the redistribution layer and the connection via include a conductive material, and the low melting point metal has a melting point lower than a melting point of the conductive material.

* * * * *